(12) United States Patent
Maejima et al.

(10) Patent No.: US 8,537,598 B2
(45) Date of Patent: *Sep. 17, 2013

(54) NONVOLATILE SEMICONDUCTOR MEMORY DEVICE AND METHOD FOR RESETTING THE SAME

(75) Inventors: Hiroshi Maejima, Chuo-ku (JP); Yuki Okukawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/475,349

(22) Filed: May 18, 2012

(65) Prior Publication Data
US 2012/0230082 A1    Sep. 13, 2012

Related U.S. Application Data

(63) Continuation of application No. 12/719,528, filed on Mar. 8, 2010, now Pat. No. 8,199,557.

(30) Foreign Application Priority Data

Mar. 12, 2009   (JP) ................................. 2009-059492

(51) Int. Cl.
  *G11C 11/00*  (2006.01)
(52) U.S. Cl.
  USPC ............ 365/148; 365/158; 365/175; 365/163
(58) Field of Classification Search
  USPC ............ 365/148, 158, 175, 163, 226, 185.19
  See application file for complete search history.

(56) References Cited

U.S. PATENT DOCUMENTS

| 7,903,448 B2 | 3/2011 | Oh et al. | |
| 8,199,557 B2 * | 6/2012 | Maejima et al. | 365/148 |
| 8,369,128 B2 * | 2/2013 | Shiimoto et al. | 365/148 |

FOREIGN PATENT DOCUMENTS

| JP | 2003-100085 | 4/2003 |
| JP | 2005-196954 | 7/2005 |
| JP | 2005-522045 | 7/2005 |
| KR | 10-2007-0115542 | 12/2007 |
| WO | WO 2008/153124 A1 | 12/2008 |

OTHER PUBLICATIONS

Office Action issued Jun. 28, 2011 in Japanese Patent Application No. 2009-059492 (with English translation).
Office Action issued Jul. 15, 2011 in Korean Patent Application No. 10-2010-20287 (with English translation).

* cited by examiner

*Primary Examiner* — David Lam
(74) *Attorney, Agent, or Firm* — Oblon, Spivak, McClelland, Maier & Neustadt, L.L.P.

(57) ABSTRACT

A nonvolatile semiconductor memory device includes: a plurality of memory cell arrays stacked on a semiconductor substrate and including a plurality of first wires, a plurality of second wires and memory cells disposed at intersections of the first wires and the second wires and having a rectifier element and a variable resistive element are connected in series; and a control circuit configured to selectively drive the first wires and the second wires. The control circuit executes a resetting operation to change a state of the variable resistive element from a low resistance state to a high resistance state. At a time of executing the resetting operation, the control circuit increases a pulse voltage to be applied to the variable resistive element to a first voltage, and then decreases the pulse voltage to a second voltage lower than the first voltage and higher than the ground voltage.

18 Claims, 11 Drawing Sheets

Row decoder 21

Main Row decoder 22

WDRV Driver 23

VRow Driver 24

Column Switch 31

Column decoder 32

Sense Amp & Write Buffer 33

VCol Driver 34

NONVOLATILE SEMICONDUCTOR MEMORY DEVICE AND METHOD FOR RESETTING THE SAME

CROSS-REFERENCE TO RELATED APPLICATIONS

This application is a continuation of U.S. application Ser. No. 12/719,528 filed Mar. 8, 2010, now U.S. Pat. No. 8,119,557, and is based upon and claims the benefit of priority from the prior Japanese Patent Application No. 2009-59492, filed on Mar. 12, 2009, the entire contents of each of which are incorporated herein by reference.

BACKGROUND OF THE INVENTION

1. Field of the Invention

The present invention relates to a nonvolatile semiconductor memory device that writes data in a nonvolatile manner by applying a voltage to a variable resistive element and a method of resetting the same.

2. Description of the Related Art

In recent years, as nonvolatile memory devices, a ReRAM and a PCRAM gather attention as memories succeeding a flash memory. The ReRAM and the PCRAM store information of a resistance value of an electrically-rewritable variable resistive element in a nonvolatile manner. A variable resistive element as a storage element of the ReRAM has an electrode/metal oxide (bi-metallic or ternary-metallic oxide)/electrode structure. It is known that the variable resistive element has two operation modes. As one of the modes, a bipolar-type variable resistive element switches between a high resistance state and a low resistance state by changing the polarity of applied voltage. As the other mode, a unipolar-type variable resistive element switches between a high resistance state and a low resistance state by controlling a voltage value and application time without changing the polarity of applied voltage.

To realize a high-density memory cell array, it is preferable to use the unipolar-type variable resistive element. In the case of the unipolar-type variable resistive element, by stacking the variable resistive element and a rectifier element such as a diode at each cross point between a bit line and a word line, a cell array can be constructed without using a transistor. A three-dimensional multilayer resistance change memory aims at increase in a memory capacity by stacking memory layers without enlarging an area of an array (refer to Japanese PCT National Publication No. 2005-522045).

The case of using a unipolar-type variable resistive element will be examined. It is known that, by applying 1.5 V (in reality, about 2.1 V in BL when 0.6 V of Vf of a diode is included) or current of about 10 nA for a period of about 10 ns to 100 ns, the variable resistive element changes from the high resistance state to the low resistance state. This is called a setting operation.

By continuously applying a voltage of 0.6 V (in reality, about 1.6 V in BL when 1.0 V of Vf of a diode is included) or a current of 1 µA to 10 µA to the element in the set state for 500 ns to 2 µs, the element changes from the low resistance state to the high resistance state. This is called a resetting operation.

In reading operation, by applying a voltage of 0.4 V (in reality, about 1.2 V in BL when 0.8 V of Vf of a diode is included) to the variable resistive element and monitoring current flowing via the resistive element, whether the variable resistive element is in the low resistance state or the high resistance state is determined.

The resetting operation will be considered on the basis of the above-described preconditions. It is assumed that a set voltage VSET and a reset voltage VRESET are close to each other, and a parasitic resistance in a wire and the like of an array is large. In such a state, in the resetting operation, at the moment when the element changes from the low resistance to the high resistance, a voltage exceeding the set voltage VSET is applied to the ReRAM, and the ReRAM is set again. That is, erroneous setting occurs. As a countermeasure against the erroneous setting for a device, it is preferable to have a large difference between the set voltage VSET and the reset voltage VRESET.

In the resetting operation, a model of causing a phase change by heat generation is dominant. Therefore, it is expected that when the voltage of a reset pulse is set to be high, a generation amount of Joule heat increases (J=V·I·t), and a pulse width can be shortened. In this case, however, the possibility that the reset voltage VRESET becomes close to the set voltage VSET and it causes the erroneous setting problem becomes higher.

SUMMARY OF THE INVENTION

A nonvolatile semiconductor memory device according to an aspect of the present invention includes: a semiconductor substrate; a plurality of memory cell arrays stacked on the semiconductor substrate and including a plurality of first wires, a plurality of second wires formed so as to cross the first wires, and memory cells disposed at intersections of the first wires and the second wires and each having a rectifier element and a variable resistive element connected in series; and a control circuit configured to selectively drive the first wires and the second wires, the control circuit executing a resetting operation to change a state of the variable resistive element from a low resistance state to a high resistance state, and at a time of executing the resetting operation, the control circuit increasing a pulse voltage to be applied to the variable resistive element to a first voltage, and then decreasing the pulse voltage to a second voltage lower than the first voltage and higher than the ground voltage.

Another aspect of the present invention provides a method of resetting a nonvolatile semiconductor memory device including a plurality of memory cell arrays stacked on a semiconductor substrate and including a plurality of first wires, a plurality of second wires formed so as to cross the first wires, and memory cells disposed at intersections of the first wires and the second wires and each having a rectifier element and a variable resistive element connected in series, the method comprising: at a time of executing resetting operation to change a state of the variable resistive element from a low resistance state to a high resistance state, increasing a pulse voltage to be applied to the variable resistive element to a first voltage, and then decreasing the pulse voltage to a second voltage lower than the first voltage and higher than the ground voltage.

DETAILED DESCRIPTION OF THE EMBODIMENTS

In the following, embodiments of the present invention will be described with reference to the appended drawings. In the embodiments, a nonvolatile semiconductor memory device will be described as a resistance-change memory device having a three-dimensional memory cell array structure in which memory cell arrays are stacked. Obviously, the configuration is merely an example and the invention is not limited to the configuration.

[First Embodiment]
[Schematic Configuration of Nonvolatile Semiconductor Memory Device According to First Embodiment]

Figure 1:
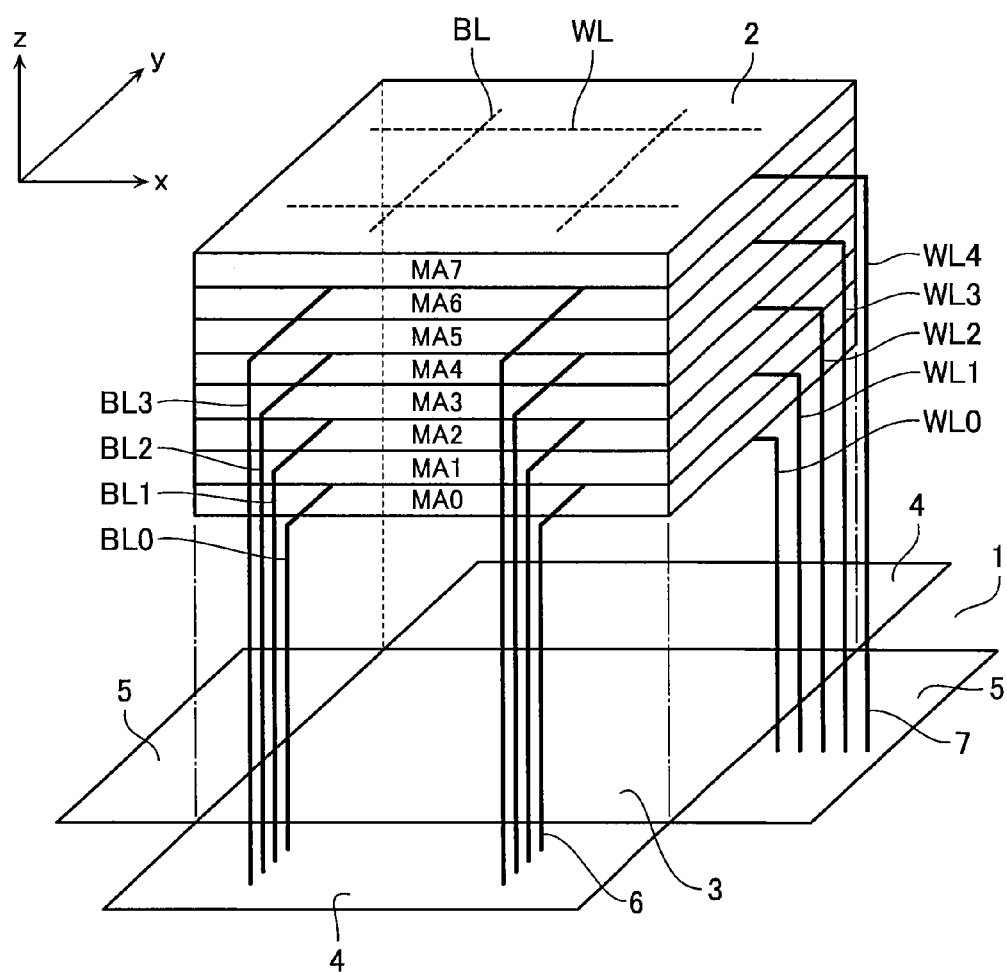
FIG. 1 is a diagram showing a basic configuration of a nonvolatile semiconductor memory device according to a first embodiment of the invention.

FIG. 1 shows a basic configuration of a nonvolatile semiconductor memory device according to a first embodiment of the invention, that is, a configuration of a wiring region 3 in which wires such as a global bus above a semiconductor substrate 1 are formed, and a memory block 2 stacked on the wiring region 3.

As shown in FIG. 1, in the example, the memory block 2 is made of eight memory cell arrays MA0 to MA7. As will be described later, each memory cell array MA shares a bit line or a word line with other memory cell arrays which are neighboring in a vertical direction. That is, one word line and one bit line are not connected to only a memory cell in one memory cell array but are connected to memory cells in two memory cell arrays which are neighboring in the vertical direction.

The semiconductor substrate 1 just below the memory block 2 is provided with the wiring region 3. The wiring region 3 is provided with a global bus for transmitting/receiving data to be written/read to/from the memory block 2 to/from the outside. The wiring region 3 may be also provided with a row control circuit 20 (FIG. 2) including a row decoder and a column control circuit 30 (FIG. 2) including a column switch which will be described later.

To connect the word lines WL and the bit lines BL of the memory cell arrays MA stacked and the wiring region 3 formed on the semiconductor substrate 1, vertical interconnections (via contacts) are necessary for the side faces of the memory block 2. The four sides of the wiring region 3 are provided with bit line contact regions 4 and word line contact regions 5. In the bit line contact regions 4 and the word line contact regions 5, bit line contacts 6 and word line contacts 7 for connecting the bit lines BL and the word lines WL and the control circuits are formed. One end of the word line WL is connected to the wiring region 3 via the word line contact 7 formed in the contact region 5. One end of the bit line BL is connected to the wiring region 3 via the bit line contact 6 formed in the bit line contact region 4.

In FIG. 1, one memory block 2 in which a plurality of memory cell arrays MA are stacked in the direction perpendicular to the semiconductor substrate 1 (the "z" direction shown in FIG. 1) is shown. In practice, a plurality of such memory blocks 2 are disposed in matrix in the longitudinal direction (the "x" direction shown in FIG. 1) of the word lines WL and the longitudinal direction ("y" direction shown in FIG. 1) of the bit lines BL.

As shown in FIG. 1, in the word line contact region 5 in the first embodiment, the word lines WL of the different layers are connected to the wiring region 3 via contacts in five columns prepared separately. In the bit line contact region 4, the bit lines BL of the different layers are connected to the wiring region 3 via contacts in four columns prepared separately. In the embodiment, the bit lines BL are driven independently on the layer unit basis, and the word lines WL are also driven independently on the layer unit basis. However, the invention is not limited to the mode. As long as the operation to be described below can be performed, a part of the bit lines BL or word lines WL may be connected commonly to one contact. The bit lines BL and/or the word lines WL may be shared by upper and lower layers.

Figure 2:
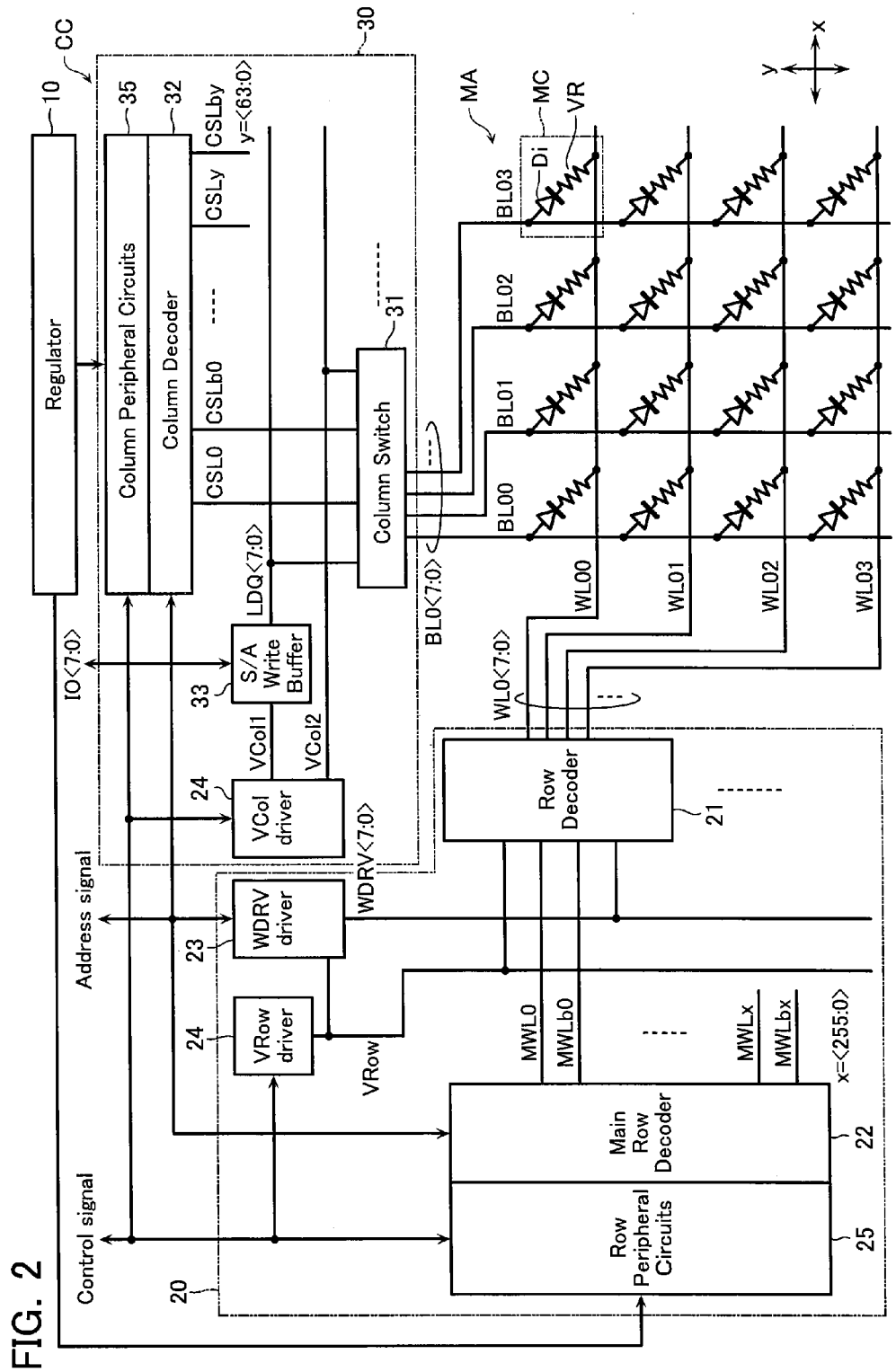
FIG. 2 is a circuit diagram of the nonvolatile semiconductor memory device according to the first embodiment.

Referring now to FIG. 2, the circuit configuration of the nonvolatile semiconductor memory device according to the first embodiment will be described. FIG. 2 is a circuit diagram of the nonvolatile semiconductor memory device according to the first embodiment.

As shown in FIG. 2, the nonvolatile semiconductor memory device according to the first embodiment includes the memory cell array MA and a control circuit CC that controls the memory cell array MA.

The memory cell array MA includes a plurality of memory cells MC disposed in a two-dimensional matrix in the extension direction of the word lines WL (the "x" direction shown in FIG. 2) and the extension direction of the bit lines BL (the "y" direction shown in FIG. 2). As shown in FIG. 2, at a crossing between the word line WL and the bit line BL, a memory cell MC of a resistance change type is disposed. The memory cell MC has a rectifying element, for example, a diode Di and a variable resistive element VR are connected in series. Ab arrangement and a polarity of the diode Di and the variable resistive element VR constructing the memory cell MC are not limited to those shown in FIG. 2.

The variable resistive element VR has, for example, an electrode/transition metal oxide/electrode structure, changes in the resistance value of the metal oxide according to an application parameter of voltage, current, heat, or the like, and stores different state of the resistance value as information in a nonvolatile manner. More specifically, the variable resistive element VR (ReRAM) whose resistance value changes according to application of voltage or current is used.

Figure 3:
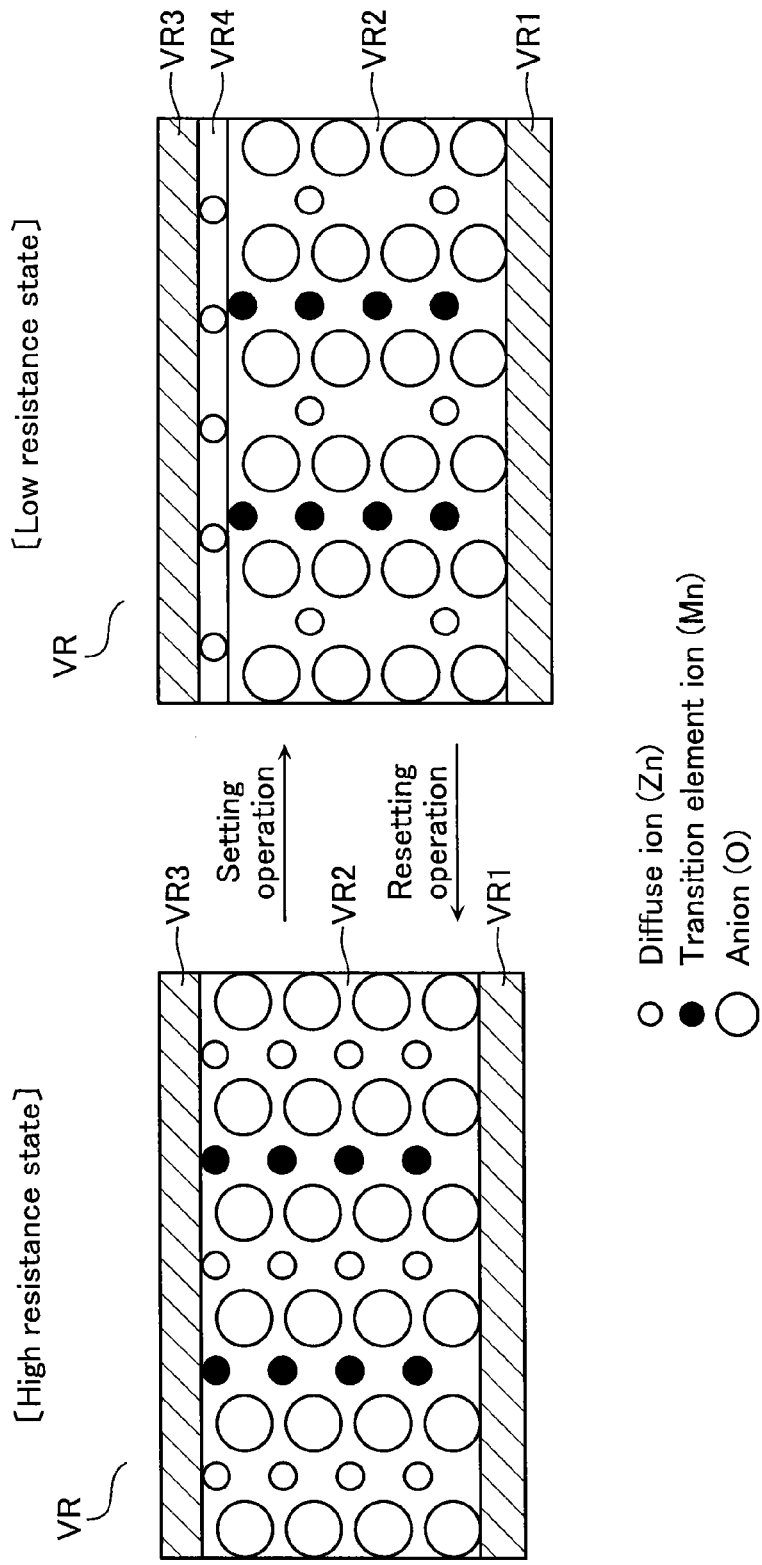
FIG. 3 is a schematic cross section showing an example of an ReRAM (variable resistive element VR) according to the first embodiment.

FIG. 3 is a diagram showing an example of the ReRAM. In the variable resistive element VR shown in FIG. 3, a recording layer VR2 is disposed between electrode layers VR1 and VR3. As shown in FIG. 3, the recording layer VR2 is made of a composite compound having at least two kinds of cationic elements. At least one of the cationic elements is a transition element having the d orbital in which the electron is incompletely filled. The shortest distance between neighboring cationic elements is 0.32 nm or less. Specifically, the recording layer VR2 is made of a material having a crystal structure expressed by a chemical formula $A_xM_yX_z$ (where A and M are elements different from each other) such as a spinel structure ($AM_2O_4$), ilmenite structure ($AMO_3$), delafossite structure ($AMO_2$), $LiMoN_2$ structure ($AMN_2$), wolframite structure ($AMO_4$), olivine structure ($A_2MO_4$), hollandite structure ($AxMO_2$), ramsdellite structure ($A_xMO_2$), or perovskite structure ($AMO_3$).

In the example of FIG. 3, A shows Zn, M shows Mn, and X shows O. Small open circles in the recording layer VR2 express diffuse ions (Zn), large open circles express anions (O), and small filled circles express transition element ions (Mn). The initial state of the recording layer VR2 is a high resistance state. When the potential of the electrode layer VR1 is fixed and negative voltage is applied to the electrode layer VR3 side, a part of the diffuse ions in the recording layer VR2 moves to the electrode layer VR3 side, and the diffuse ions in the recording layer VR2 decrease relative to the anions. The diffuse ions having moved to the electrode layer VR3 side receive electrons from the electrode layer VR3 and are precipitated as metal, thereby forming a metal layer VR4. In the recording layer VR2, anions become excessive. As a result, the valence of the transition element ions in the recording layer VR2 increases. Consequently, by injection of carriers, the recording layer VR2 comes to have electron conductivity, and the setting operation is completed. For reading, it is sufficient to pass a small current value to a degree that no resistance change occurs in the material of the recording layer VR2. To reset the program state (low resistance state) to the initial state (high resistance state), for example, it is sufficient to pass large current to the recording layer VR2 for sufficient time to perform Joule heating, thereby promote oxidation-reduction reaction of the recording layer VR2. The resetting operation can be also performed by applying electric field in the direction opposite to that in the setting operation.

As shown in FIG. 2, the control circuit CC includes a regulator 10, a row control circuit 20, and a column control circuit 30.

The regulator 10 supplies, as shown in FIG. 2, a signal adjusted to a predetermined voltage to the row control circuit 20 and the column control circuit 30.

As shown in FIG. 2, the row control circuit 20 includes, for example, a row decoder 21, a main row decoder 22, a write drive line driver 23, a row power supply line driver 24, and row peripheral circuits 25.

The word lines according to the first embodiment have a hierarchical structure. The main row decoder 22 selectively drives any one of 256 pairs of main word lines MWLx and MWLbx (x=<255:0>). As an example, in the selected main word lines MWLx and MWLbx, the main word line MWLx becomes the "H" state, and the main word line MWLbx becomes the "L" state.

On the contrary, in the main word lines MWLx and MWLbx which are not selected, the main word line MXLx becomes the "L" state, and the main word line MXLbx becomes the "H" state. A pair of main word lines MWLx and MWLbx is connected to the row decoder 21, and the row decoder 21 selects and drives one of eight word lines WLx<7:0> in a layer below the main word lines MWLx and MWLbx.

When the row decoder 21 connected to the main word lines MWLx and MWLbx selected and driven by the main row decoder 22 selectively drives the word line WL, one word line WL is selectively driven. To the write drive line driver 23, eight write drive lines WDRV<7:0> and a row power supply line VRow are connected. To the row power supply line driver 24, the row power supply line VRow is connected.

To the row power supply line VRow, a voltage (VSET) to be supplied to the word lines WL below the layer of the unselected main word lines MWLx and MWLbx and the unselected word lines WL below the layer of the selected main word lines MWLx and MWLbx is applied. The write drive lines WDRV<7:0> and the row power supply line VRow are connected to the row decoder 21, and voltages for the row decoder 21 to drive the word line WL are applied. Specifically, in the setting operation, voltage Vss (=0 V) is supplied to one write drive line WDRV corresponding to the selected word line WL in the eight write drive lines WDRV<7:0>, and the voltage VSET is supplied to the other seven write drive lines WDRV.

The row peripheral circuits 25 manage the entire nonvolatile semiconductor memory device, receive a control signal from an external host device, and perform reading, writing, erasing, data input/output control, and the like.

As shown in FIG. 2, the column control circuit 30 includes, for example, a column switch 31, a column decoder 32, a sense amplifier/write buffer 33, a column power supply line driver 34, and column peripheral circuits 35.

The bit lines according to the first embodiment also have a hierarchical structure. The column decoder 32 selectively drives any one of 64 pairs of column selection lines CSLy and CSLby (y=<63:0>). As an example, in the selected column selection lines CSLy and CSLby, the column selection line CSLy becomes the "H" state, and the column selection line CSLby becomes the "L" state. On the contrary, in the column selection lines CSLy and CSLby which are not selected, the column selection line CSLy becomes the "L" state, and the column selection line CSLby becomes the "H" state. The pair of column selection lines CSLy and CSLby is connected to the column switch 31, and the column switch 31 selects and drives one of eight bit lines BLy<7:0> below the layer of the column selection lines CSLy and CSLby.

When the column switch 31 connected to the column selection lines CSLy and CSLby selected and driven by the column decoder 32 selectively drives the bit line BL, one bit line BL is selectively driven. The sense amplifier/write buffer 33 detects and amplifies signals read to local data lines LDQ<7: 0> and supplies write data input from data input/output lines 10<7:0> to the memory cells MC via the column switch 31. To the sense amplifier/write buffer 33, eight local data lines LDQ<7:0> and a column power supply line VCol1 are connected. To the column power supply line driver 34, column power supply lines VCol1 and VCol2 are connected. The local data lines LDQ<7:0> and the column power supply lines VCol1 and VCol2 are connected to the column switch 31, and voltages for the column switch 31 to drive bit lines BL are applied. Specifically, in the setting operation, the voltage VSET is supplied to one local data line LDQ corresponding to the selected bit line BL in the eight local data lines LDQ<7: 0>, and zero voltage (0 V) is supplied to the other seven local data lines LDQ.

The column peripheral circuits 35 manage the entire resistance change memory device, receive a control signal from an external host device, and perform reading, writing, erasing, data input/output control, and the like.

[Configuration of Regulator 10]

Figure 4:
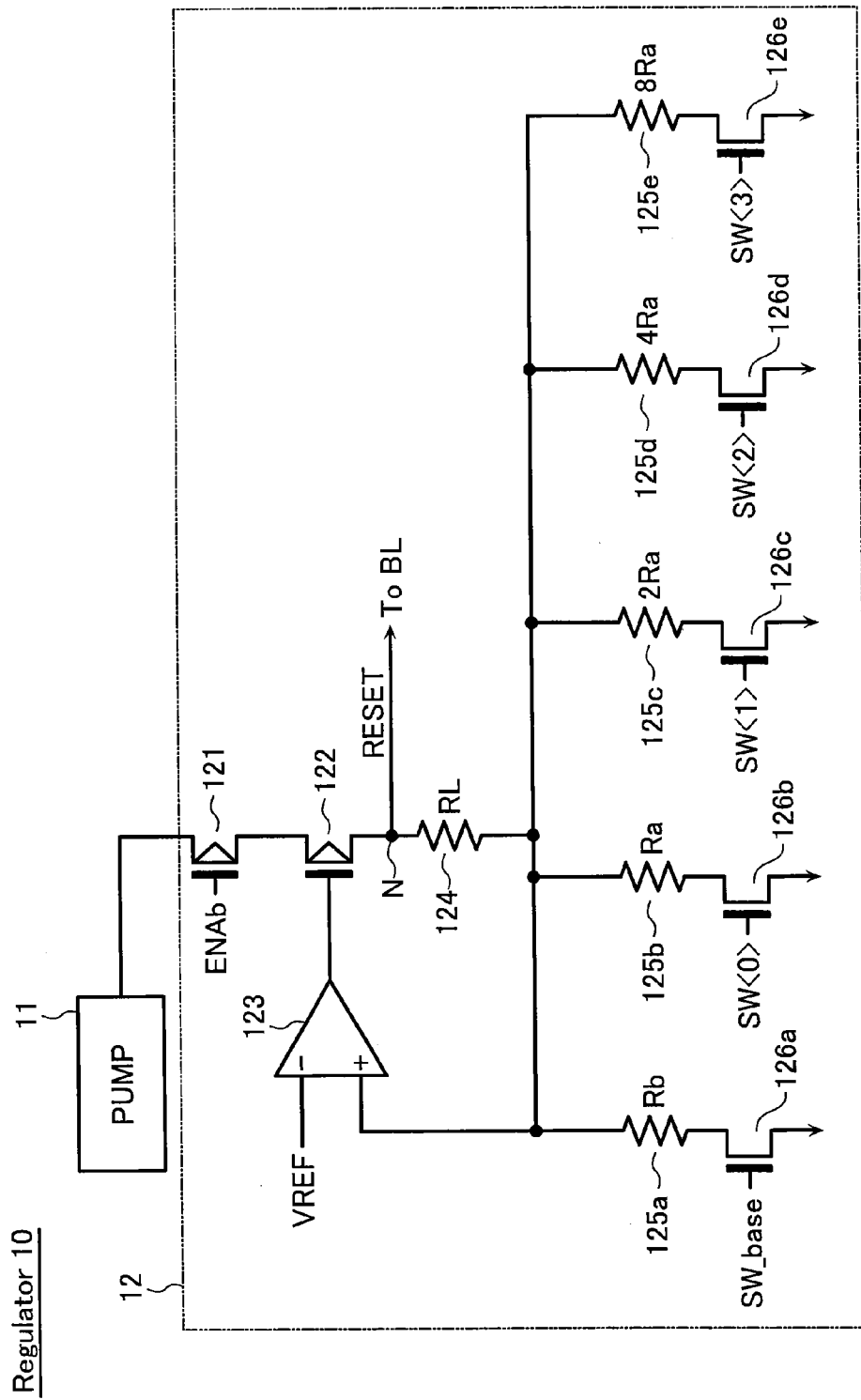
FIG. 4 is a circuit diagram showing a configuration example of a regulator 10 in the nonvolatile semiconductor memory device according to the first embodiment.

Referring now to FIG. 4, the configuration of the regulator 10 will be described in detail. FIG. 4 is a circuit diagram showing a configuration example of the regulator 10 in the nonvolatile semiconductor memory device according to the first embodiment.

As shown in FIG. 4, the regulator 10 includes a booster 11 and a voltage converter 12. The booster 11 generates a boosted voltage obtained by boosting predetermined voltage, and applies the boosted voltage to the voltage converter 12.

The voltage converter 12 includes, as shown in FIG. 4, P-MOS transistors 121 and 122, a differential amplifier 123, resistors 124 and 125a to 125e, and N-MOS transistors 126a to 126e.

One end of the P-MOS transistor 121 is connected to the booster 11. The other end of the P-MOS transistor 121 is connected to one end of the P-MOS transistor 122. The gate of the P-MOS transistor 121 receives a signal ENAb. The other end of the P-MOS transistor 122 is connected to one end of the resistor 124, and the gate of the P-MOS transistor 122 receives a signal from the differential amplifier 123.

A – side input terminal of the differential amplifier 123 is connected to a reference voltage VREF. A + side input terminal of the differential amplifier 123 is connected to one end of the resistor 125a.

One end of the resistor 124 is connected to one end (node N) of the P-MOS transistor 122. The node N is connected to the bit line BL via the column control circuit 30, and a signal VRESET is output from the node N. The other end of the resistor 124 is connected to one end of each of the resistors 125a to 125e. The resistor 124 has a resistance value "RL".

One ends of the resistors 125a to 125e are connected to the other end of the resistor 124 and the + side input terminal of the differential amplifier 123. The other ends of the resistors 125a to 125e are connected to one ends of the N-MOS transistors 126a to 126e, respectively. The resistor 125a has a resistance value of "Rb". The resistor 125b has a resistance value of "Ra". The resistor 125c has a resistance value of "2Ra". The resistor 125d has a resistance value of "4Ra". The resistor 125e has a resistance value of "8Ra".

The other ends of the N-MOS transistors 126a to 126e are grounded. The gate of the N-MOS transistor 126a receives a signal SW_base. The gate of the N-MOS transistor 126b receives a signal SW<0>. The gate of the N-MOS transistor 126c receives a signal SW<1>. The gate of the N-MOS transistor 126d receives a signal SW<2>.

The gate of the N-MOS transistor 126e receives a signal SW<3>.

The regulator 10 having the configuration described above regulates the voltage of the signal RESET by controlling the on/off state of the N-MOS transistors 126a to 126e.

Next, with reference to FIGS. 2 and 5 to 8, the configuration of the row control circuit 20 will be described in detail. FIGS. 5 to 8 are circuit diagrams showing a configuration example of the row control circuit 20 of the nonvolatile semiconductor memory device according to the first embodiment.

[Configuration of Row Decoder 21]

Figure 5:
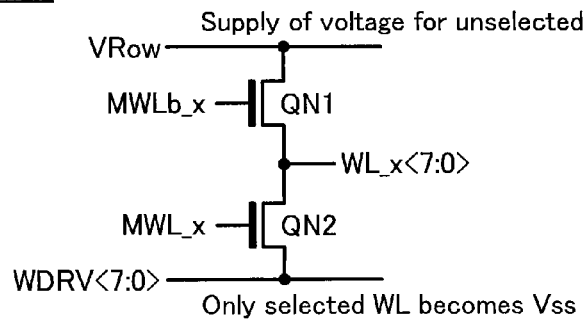
FIG. 5 is a circuit diagram showing a configuration example of a row control circuit 20 in the nonvolatile semiconductor memory device according to the first embodiment.

As shown in FIGS. 2 and 5, to the row decoder 21, any one pair of the 256 pairs of main word lines MWLx and MWLbx (x=<255:0>), the row power supply line VRow, and the write drive lines WDRV<7:0> are connected. The word lines WLx<7:0> are also connected to the row decoder 21. The word lines WLx<7:0> are connected to the plurality of memory cells MC provided in lines. As described above, the word lines WLx<7:0> connected to one row decoder 21 are eight word lines WLx0 to WLx7. Similarly, the write drive lines WDRV<7:0> are eight lines WDRV0 to WDRV7. As shown in FIG. 5, the row decoder 21 is constructed by eight pairs of NMOS transistors QN1 and QN2 whose sources are connected to each other. The main word line MWLbx is connected to the gate of the transistor QN1, and the row power supply lien VRow is connected to the drain. The main word line MWLx is connected to the gate of the transistor QN2, and any one of the write drive lines WDRV<7:0> is connected to the drain. The sources of the transistors QN1 and QN2 are connected to any one of the word lines WLx<7:0>.

[Configuration of Main Row Decoder 22]

Figure 6:
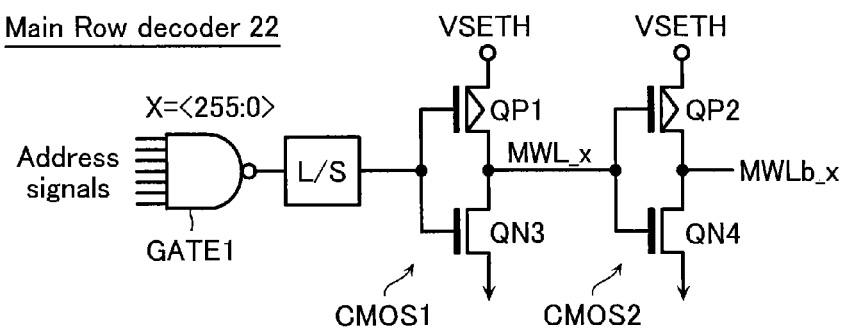
FIG. 6 is a circuit diagram showing a configuration example of the row control circuit 20 in the nonvolatile semiconductor memory device according to the first embodiment.

As shown in FIGS. 2 and 6, to the main row decoder 22, 256 pairs of main word lines MWLx and MWLbx (x=<255:0>) and address signal lines are connected. The word lines of the nonvolatile semiconductor memory device according to the first embodiment have a hierarchical structure. The main row decoder 22 is a predecoder. One pair of main word lines MWLx and MWLbx is connected to eight transistor pairs (QN1 and QN2 in FIG. 5) in one row decoder 21. One row decoder 21 can select any one of the eight word lines WLx<7: 0>. The main row decoder 22 includes a circuit as shown in FIG. 6 for every pair of main word lines MWLx and MWLbx. As shown in FIG. 6, in one main row decoder 22, the address signal lines connected to the main row decoder 22 are connected to a logic gate GATE1. An output signal of the logic gate GATE1 is supplied to the input terminal of a CMOS inverter CMOS1, composed of a PMOS transistor QP1 and an NMOS transistor QN3, via a level shifter L/S. A power supply VSETH is connected to a source of the transistor QP1, and a source of the transistor QN3 is grounded. Both of drains of the transistors QP1 and QN3 are connected to the main word line MWLx. The main word line MWLx is connected to a CMOS inverter CMOS2 composed of a PMOS transistor QP2 and an NMOS transistor QN4. The power supply VSETH is connected also to a source of the transistor QP2, and a source of the transistor QN4 is grounded. Both of drains of the transistors QP2 and QN4 are connected to the main word line MWLbx.

[Configuration of Write Drive Line Driver 23]

Figure 7:
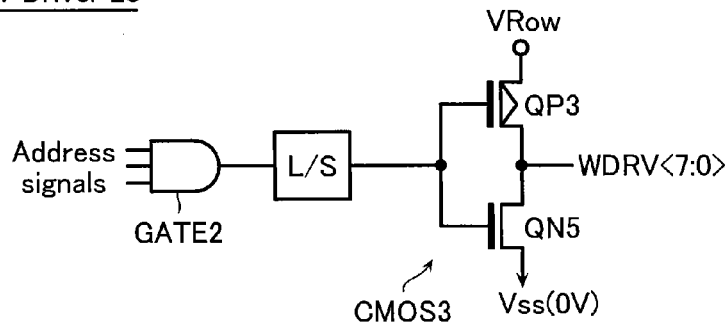
FIG. 7 is a circuit diagram showing a configuration example of the row control circuit 20 in the nonvolatile semiconductor memory device according to the first embodiment.

As shown in FIGS. 2 and 7, the row power supply line VRow and the address signal lines are connected to the write drive line driver 23. The write drive line driver 23 is also a predecoder. The address signal lines connected to the write drive line driver 23 are connected to a logic gate GATE2. An output signal of the logic gate GATE2 is supplied to the input terminal of a CMOS inverter CMOS3, composed of a PMOS transistor QP3 and an NMOS transistor QN5, via the level shifter L/S. As will be described later, the row power supply line VRow to which a voltage VSET is applied is connected to a source of the transistor QP3, and a source of the transistor QN5 is grounded. Both of drains of the transistors QP3 and QN5 are connected to the write drive lines WDRV<7:0>.

[Configuration of Row Power Supply Line Driver 24]

Figure 8:
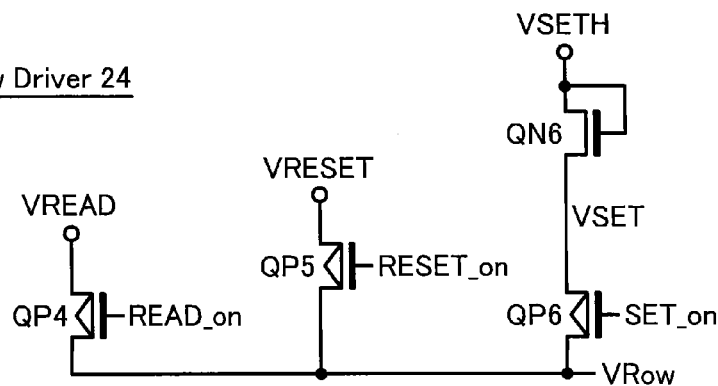
FIG. 8 is a circuit diagram showing a configuration example of the row control circuit 20 in the nonvolatile semiconductor memory device according to the first embodiment.

As shown in FIGS. 2 and 8, the row power supply line VRow and a control signal line are connected to the row power supply line driver 24. In the row power supply line driver 24, a power supply VREAD is connected to the row power supply line VROW via a PMOS transistor QP4, and a power supply VRESET is connected to the row power supply line VRow via a PMOS transistor QP5. A control signal READon is supplied to a gate of the transistor QP4, and a control signal RESETon is supplied to a gate of the transistor QP5. The control signals READon and RESETon change from the "H" state to the "L" state at the time of the data reading operation and the resetting operation, respectively. The power supply VSETH is connected to the row power supply line driver 24. The power supply VSETH is connected to a drain and a gate of an NMOS transistor QN6, and a source of the transistor QN6 is connected to a source of a PMOS transistor QP6. A drain of the PMOS transistor QP6 is connected to the row power supply line VRow. A control signal SETon is supplied to the gate of the transistor QP6.

Referring now to FIGS. 2 and 9 to 12, the configuration of the column control circuit 30 will be described in detail. FIGS. 9 to 12 are circuit diagrams showing a configuration example of the column control circuit 30 of the nonvolatile semiconductor memory device according to the first embodiment.

[Configuration of Column Switch 31]

Figure 9:
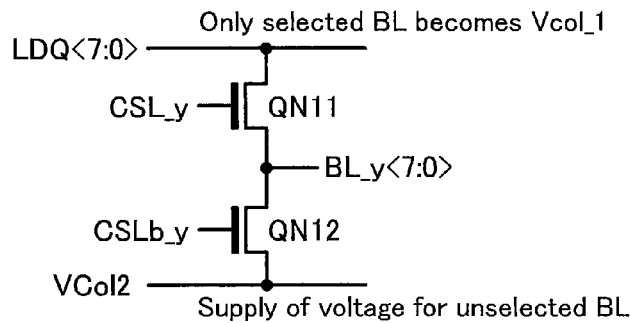
FIG. 9 is a circuit diagram showing a configuration example of a column control circuit 30 in the nonvolatile semiconductor memory device according to the first embodiment.

As shown in FIGS. 2 and 9, to the column switch 31, any one pair of the 64 pairs of column selection lines CSLy and CSLby (y=<63:0>), the column power supply line VCo12, and the local data lines LDQ<7:0> are connected. The bit lines BLy<7:0> are also connected to the column switch 31. The bit lines BLy<7:0> are connected to the plurality of memory cells MC provided in lines. As described above, the bit lines BLy<7:0> connected to one column switch 31 are eight bit lines BLy0 to BLy7. Similarly, the local data lines LDQ<7:0> are eight lines LDQ0 to LDQ7. As shown in FIG. 9, the column switch 31 is constructed by eight pairs of NMOS transistors QN11 and QN12 whose sources are connected to each other. The column selection line CSLy is connected to a gate of the transistor QN11, and any one of the local data lines LDQ<7:0> is connected to a drain of the transistor QN11.

The column selection line CSLy is connected to the gate of the transistor QN12, and the column power supply line VCo12 is connected to a drain of the transistor QN12. Sources of the transistors QN11 and QN12 are connected to any one of the bit lines BLy<7:0>.

[Configuration of Column Decoder 32]

Figure 10:
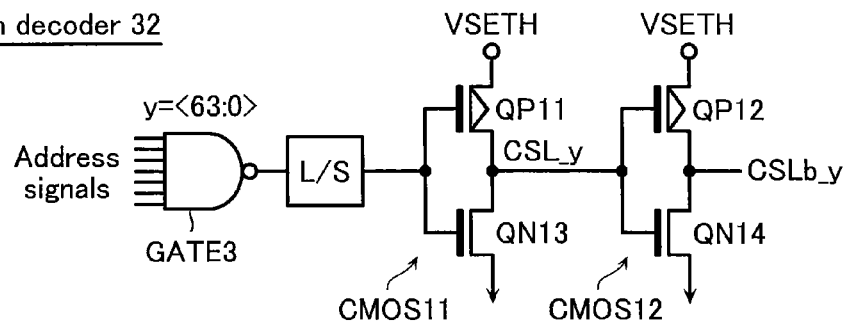
FIG. 10 is a circuit diagram showing a configuration example of the column control circuit 30 in the nonvolatile semiconductor memory device according to the first embodiment.

As shown in FIGS. 2 and 10, to the column decoder 32, 64 pairs of column selection lines CSLy and CSLby (y=<63:0>) and address signal lines are connected. In the resistance-change memory device according to the first embodiment, one pair of column selection lines CSLy and CSLby is connected to eight transistor pairs (QN11 and QN12 in FIG. 9) in one column switch 31. One column switch 31 can select any one of the eight bit lines BLy<7:0>.

The column decoder 32 includes a circuit as shown in FIG. 10 for every pair of column selection lines CSLy and CSLby. As shown in FIG. 10, in one column decoder 32, the address signal lines connected to the column decoder 32 are connected to a logic gate GATE3. An output signal of the logic gate GATE3 is supplied to the input terminal of a CMOS inverter CMOS11, composed of a PMOS transistor QP11 and an NMOS transistor QN13, via the level shifter L/S. The power supply VSETH is connected to a source of the transistor QP11, and a source of the transistor QN13 is grounded. Both of drains of the transistors QP11 and QN13 are connected to the column selection line CSLy. The column selection line CSLy is connected to a CMOS inverter CMOS12 composed of a PMOS transistor QP12 and an NMOS transistor QN14. The power supply VSETH is connected also to a source of the transistor QP12, and a source of the transistor QN14 is grounded. Both of drains of the transistors QP12 and QN14 are connected to the column selection line CSLby.

[Configuration of Sense Amplifier/Write Buffer 33]

Figure 11:
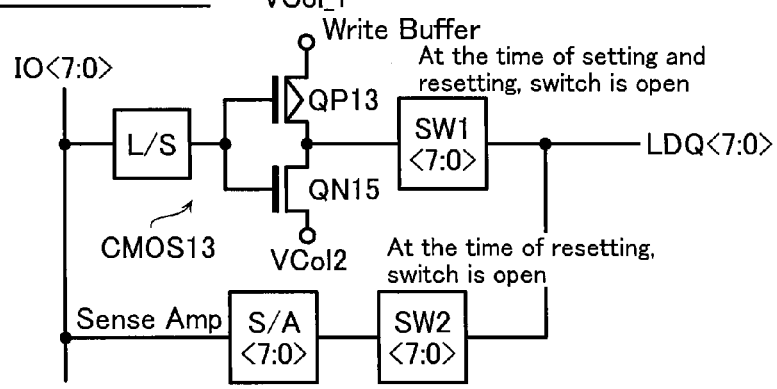
FIG. 11 is a circuit diagram showing a configuration example of the column control circuit 30 in the nonvolatile semiconductor memory device according to the first embodiment.

As shown in FIGS. 2 and 11, to the sense amplifier/write buffer 33, the column power supply line VCol1, the local data lines LD<7:0> and the data input/output lines IO<7:0> are connected. First, the configuration of a write buffer portion will be described. The data input/output lines IO<7:0> connected to the sense amplifier/write buffer 33 are connected to a CMOS inverter CMOS13, composed of a PMOS transistor QP13 and an NMOS transistor QN15, via the level shifter L/S. The column power supply line VCol1 is connected to a source of the transistor QP13. As will be described later, the voltage VSET is applied to the column power supply line VCol1. The column power supply line VCol2 is connected to a source of the transistor QN15. Both of drains of the transistors QP13 and QN15 are connected to the local data lines LDQ<7:0> via a switch SW1. Next, the configuration of the sense amplifier portion will now be described. The data input/output lines IO<7:0> connected to the sense amplifier/write buffer 33 are connected to the sense amplifier S/A. As the sense amplifier S/A, various types such as a single-end type and a differential type using a reference cell can be used. An output terminal of the sense amplifier S/A is connected to the local data lines LDQ<7:0> via a switch SW2.

[Configuration of Column Power Supply Line Driver 34]

Figure 12:
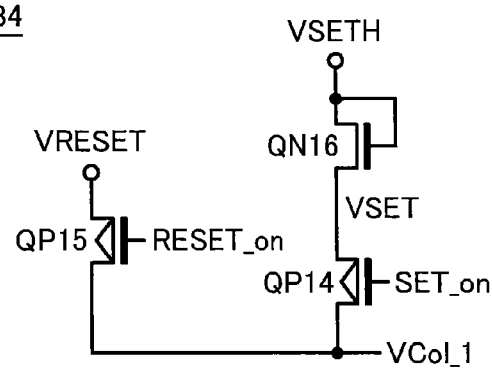
FIG. 12 is a circuit diagram showing a configuration example of the column control circuit 30 in the nonvolatile semiconductor memory device according to the first embodiment.

As shown in FIGS. 2 and 12, to the column power supply line driver 34, the column power supply lines VCol1 and VCo12 and a control signal line are connected. In the column power supply line driver 34, the power supply VRESET is connected to the column power supply line VCol1 via a PMOS transistor QP15. The control signal RESETon is supplied to a gate of the transistor QP15. The power supply VSETH is connected to a drain and a gate of an NMOS transistor QN16, and the source of the transistor QN16 is connected to the column power supply line VCol1 via a PMOS transistor QP14. The control signal SETon is supplied to the gate of the transistor QP14.

[Resetting Operation of Nonvolatile Semiconductor Memory Device According to First Embodiment]

Figure 13:
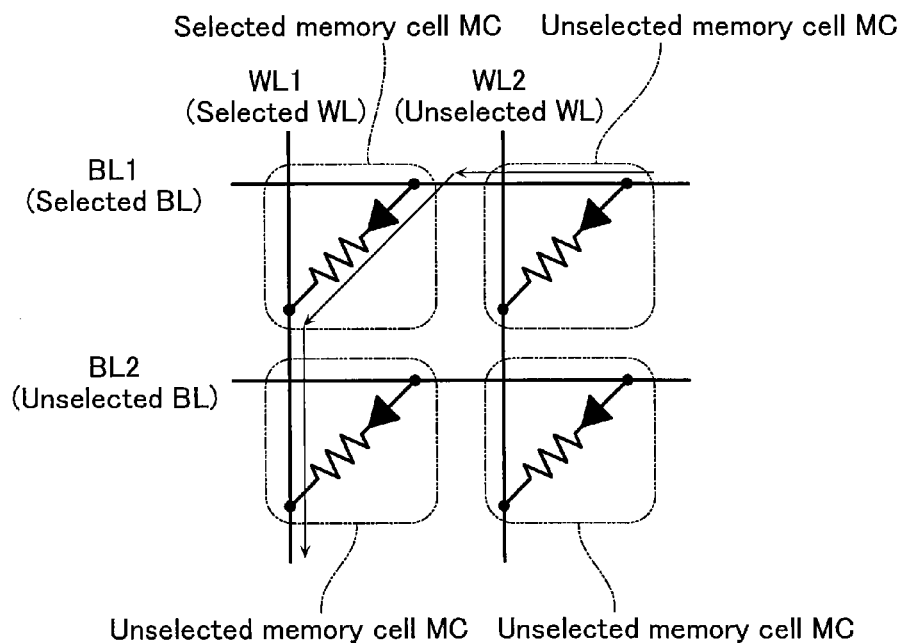
FIG. 13 is a schematic diagram showing a resetting operation of the nonvolatile semiconductor memory device according to the first embodiment.
Figure 14:
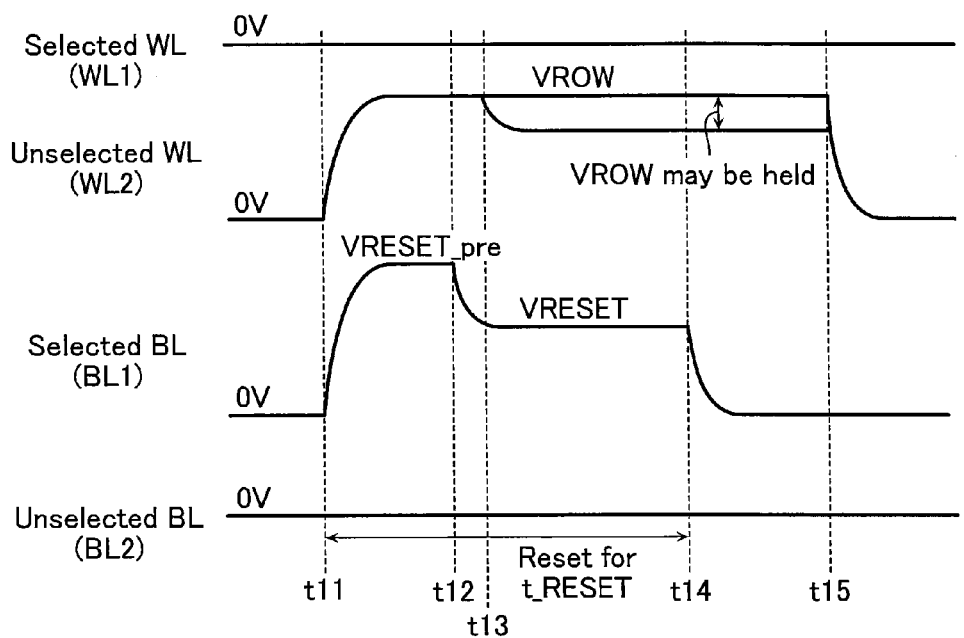
FIG. 14 is a timing chart showing the resetting operation of the nonvolatile semiconductor memory device according to the first embodiment.

Referring now to FIGS. 13 and 14, the resetting operation of the nonvolatile semiconductor memory device according to the first embodiment will be described. FIG. 13 is a schematic diagram showing the resetting operation of the non-volatile semiconductor memory device according to the first embodiment. FIG. 14 is a timing chart showing the resetting operation of the nonvolatile semiconductor memory device according to the first embodiment.

In the first embodiment, as shown in FIG. 13, the resetting operation is executed on a memory cell MC (selected memory cell MC) connected to the bit line BL1 (selected bit line BL) and the word line WL1 (selected word line WL).

At the time of resetting, as shown in FIG. 14, first, at time t11, the control circuit CC increases pulse voltage to be applied to the selected bit line BL to voltage VRESET_pre. The voltage VRESET_pre is equal to or higher than a set voltage (for example, 2.1 V) at which the variable resistive element changes VR from the high resistance state to the low resistance state. The control circuit CC increases a voltage to be applied to the unselected word line WL to voltage VROW at time t11.

Next, at time t12, the control circuit CC decreases the voltage to be applied to the selected bit line BL to voltage VRESET. The voltage VRESET is lower than the set voltage at which the variable resistive element VR changes from the high resistance state to the low resistance state. Subsequently, at time t13, the control circuit CC decreases the voltage to be applied to the unselected word line WL by a predetermined amount. The control circuit CC may hold the voltage to be applied to the unselected word line WL at time t13.

At time t14, the control circuit CC decreases the voltage to be applied to the selected bit line BL to the ground voltage. At time t15, the control circuit CC decreases the voltage to be applied to the unselected word line WL to the ground voltage.

As described above, by the voltage applied to the selected word line WL and the selected bit line BL from time t11 to time t12, the voltage VRESET_pre is applied to the selected memory cell MC. By the voltage applied to the selected word line WL and the selected bit line BL from time t12 to time t14, the voltage VRESET is applied to the selected memory cell MC. By the voltages applied to the selected memory cell MC from time t11 to time t14, the data in the selected memory cell MC is reset.

In the resetting operation, the time (t11 to t12) during which the voltage VRESET_pre is applied to the selected bit line BL is shorter than the time (t12 to t14) during which the voltage VRESET is applied to the selected bit line BL.

In the resetting operation (t11 to t14) of the selected memory cell MC, the unselected word line WL is set to the voltage VROW, and the selected bit line BL is set to the ground voltage. That is, the inverse-bias voltage VROW is applied to the unselected memory cell MC. By the application, the state of the unselected memory cell MC is not changed.

[Resetting Operation of Regulator 10]

Figure 15:
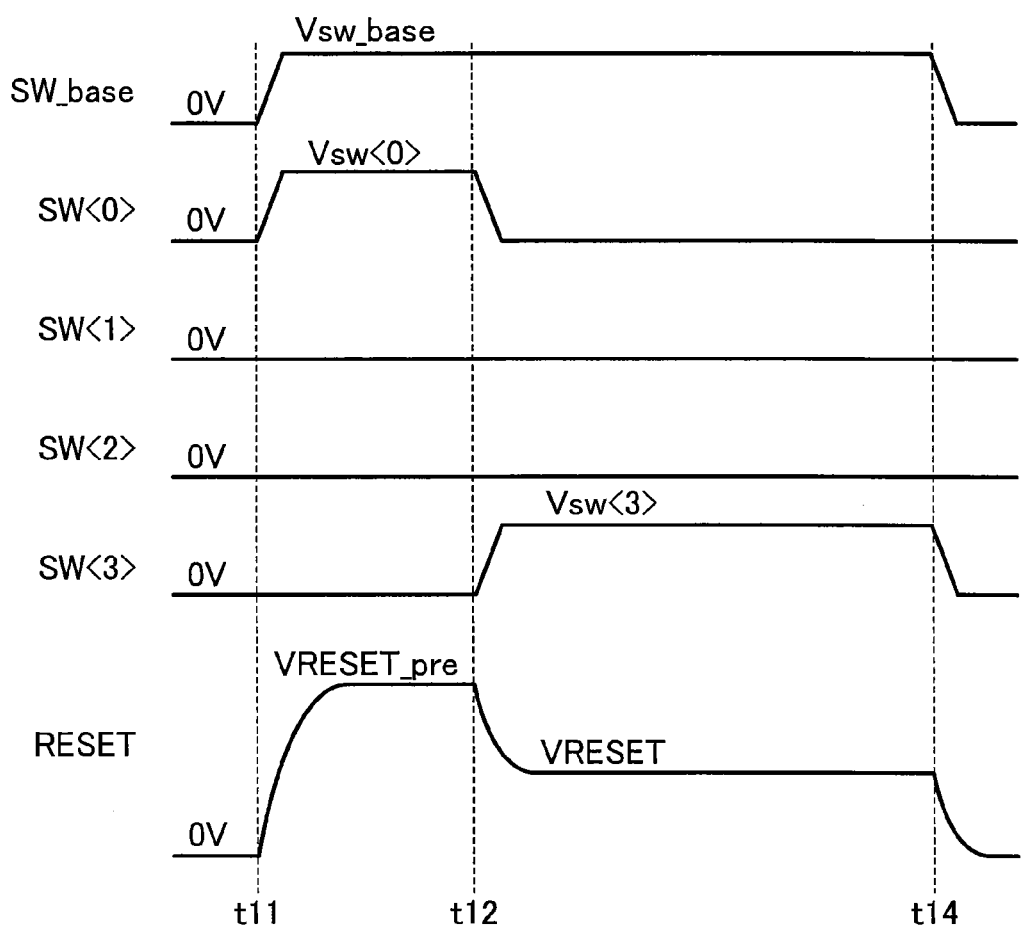
FIG. 15 is a timing chart showing the resetting operation of the regulator 10.

Next, referring to FIG. 15, the resetting operation of the regulator 10 according to the first embodiment will be described. FIG. 15 is a timing chart showing the resetting operation of the regulator 10.

As shown in FIG. 15, at time t11, a signal SW_base is increased to voltage Vsw_base. At time t11, the signal SW<0> is increased to voltage Vsw<0>. As a result, the N-MOS transistors 126a and 126b enter the "on state" (refer to FIG. 4). On the basis of the output of the sense amplifier 123, the P-MOS transistor 122 enters the "on state" (refer to FIG. 4). By this operation, on the basis of the resistance value "RL" of the resistor 124, the resistance value "Rb" of the resistor 125a, and the resistance value "Ra" of the resistor 125b, the signal RESET is increased to the voltage VRESET_pre.

At time t12, the signal SW<0> is decreased to the ground voltage. At time t12, the signal SW<3> is increased to the voltage Vsw<3>. As a result, the N-MOS transistor 126b enters the "off state", and the N-MOS transistor 126e enters the "on state" (refer to FIG. 4). By this operation, on the basis of the resistance value "RL" of the resistor 124, the resistance value "Rb" of the resistor 125a, and the resistance value "8Ra" of the resistor 125e, the signal RESET is decreased to the voltage VRESET.

Subsequently, at time t14, the signal SW_base is decreased to the ground voltage. At time t14, the signal SW<3> is decreased to the ground voltage. As a result, the N-MOS transistors 126a and 126e enter the "off state". By this operation, the signal RESET becomes the ground voltage.

[Advantages of Nonvolatile Semiconductor Memory Device According to First Embodiment]

Next, the advantages of the nonvolatile semiconductor memory device according to the first embodiment will be described. In the nonvolatile semiconductor memory device according to the first embodiment, at the time of executing the resetting operation, the pulse voltage to be applied to the variable resistive element VR is increased to the voltage VRESET_pre, and then decreased to a voltage VRESET lower than the voltage VRESET_pre and higher than the ground voltage. By this operation, the nonvolatile semiconductor memory device according to the first embodiment can execute the resetting operation in a short time and suppress occurrence of erroneous setting.

[Second Embodiment]
[Operation of Nonvolatile Semiconductor Memory Device According to Second Embodiment]

Figure 16:
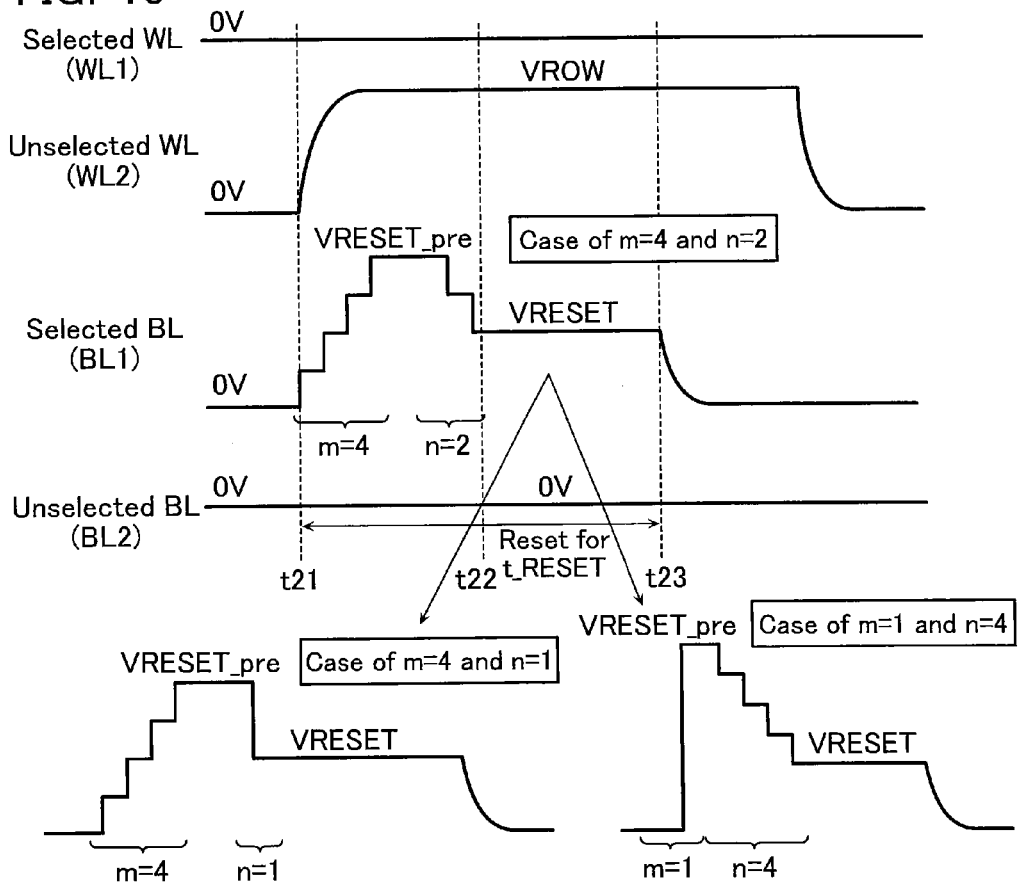
FIG. 16 is a timing chart showing a resetting operation of a nonvolatile semiconductor memory device according to a second embodiment.

Referring now to FIG. 16, the operation of the nonvolatile semiconductor memory device according to a second embodiment will be described. FIG. 16 is a timing chart showing a resetting operation of the nonvolatile semiconductor memory device according to the second embodiment. Only the resetting operation in the nonvolatile semiconductor memory device according to the second embodiment is different from that of the first embodiment. In the second embodiment, the same reference numerals are designated to components similar to those of the first embodiment and their description will not be repeated.

First, as shown in FIG. 16, at time t21, the control circuit CC changes the voltage of the selected bit line BL to a shape having "m" steps (m is an integer) and increases it to the voltage VRESET_pre. Next, at time t22, the control circuit CC changes the voltage of the selected bit line BL to a shape having "n" steps (n is an integer) and decrease it to the voltage VRESET. Subsequently, the control circuit CC decreases the voltage of the selected bit line BL to the ground voltage at time t23.

For example, as shown in FIG. 16, the voltage of the selected bit line BL1 changes in four steps from the ground voltage to the voltage VRESET_pre, and changes in two steps from the voltage VRESET_pre to the voltage VRESET (m=4, n=2). For example, the voltage of the selected bit line BL1 changes in four steps from the ground voltage to the voltage VRESET_pre and linearly changes from the voltage VRESET_pre to the voltage VRESET (m=4, n=1). For example, the voltage of the selected bit line BL1 linearly changes from the ground voltage to the voltage VRESET_pre and changes in four steps from the voltage VRESET_pre to the voltage VRESET (m=1, n=4).

That is, in at least one of a case of increasing a pulse voltage to be applied to the selected memory cell MC to the voltage VRESET_pre and a case of decreasing the pulse voltage to be applied to the selected memory cell MC to VRESET, the control circuit CC changes the pulse voltage in steps.

[Advantages of Nonvolatile Semiconductor Memory Device According to Second Embodiment]

The nonvolatile semiconductor memory device according to the second embodiment has the characteristics similar to those of the first embodiment, and produces advantages similar to those of the first embodiment.

[Third Embodiment]
[Operation of Nonvolatile Semiconductor Memory Device According to Third Embodiment]

Figure 17:
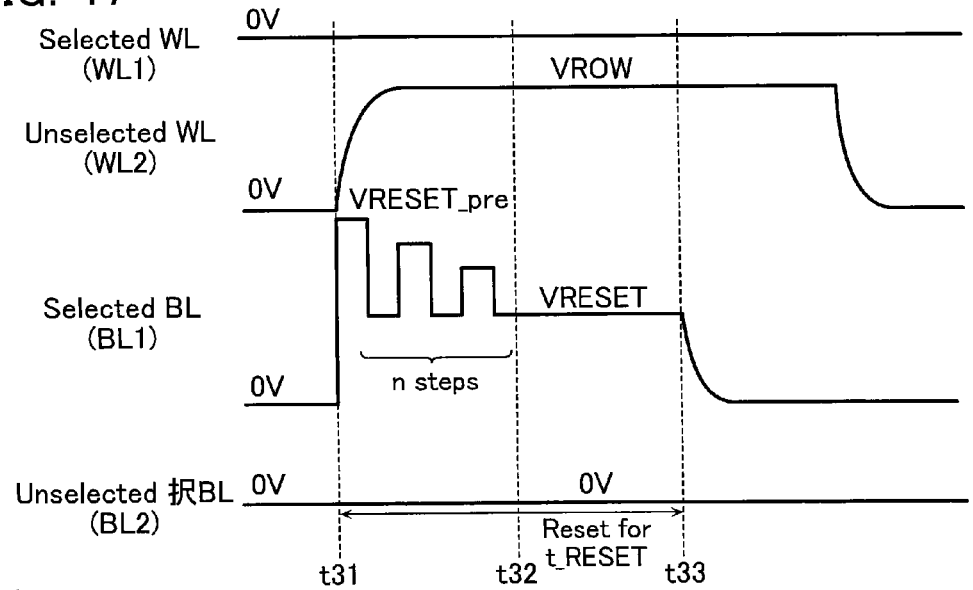
FIG. 17 is a timing chart showing a resetting operation according to a third embodiment.

Referring now to FIG. 17, the operation of the nonvolatile semiconductor memory device according to a third embodiment will be described. FIG. 17 is a timing chart showing a resetting operation of the nonvolatile semiconductor memory device according to the third embodiment. Only the resetting operation in the nonvolatile semiconductor memory device according to the third embodiment is different from that of each of the first and second embodiments. In the third embodiment, the same reference numerals are designated to components similar to those of the first and second embodiments and their description will not be repeated.

First, as shown in FIG. 17, at time t31, the control circuit CC increases the pulse voltage to be applied to the selected bit line BL1 to the voltage VRESET_pre. Next, at time t32, the control circuit CC changes the voltage of the selected bit line BL1 in a comb-teeth-shape in which a peak value decreases with lapse of time and decreases it to the voltage VRESET. That is, the control circuit CC changes the pulse voltage to be applied to the selected memory cell MC in a comb-teeth-shape in which a peak value decreases with lapse of time and decreases it to the voltage VRESET. Subsequently, the control circuit CC decreases the voltage of the selected bit line BL to the ground voltage at time t33.

[Advantages of Nonvolatile Semiconductor Memory Device According to Third Embodiment]

The nonvolatile semiconductor memory device according to the third embodiment has the characteristics similar to those of the first embodiment, and produces advantages similar to those of the first embodiment.

[Fourth Embodiment]
[Operation of Nonvolatile Semiconductor Memory Device According to Fourth Embodiment]

Figure 18:
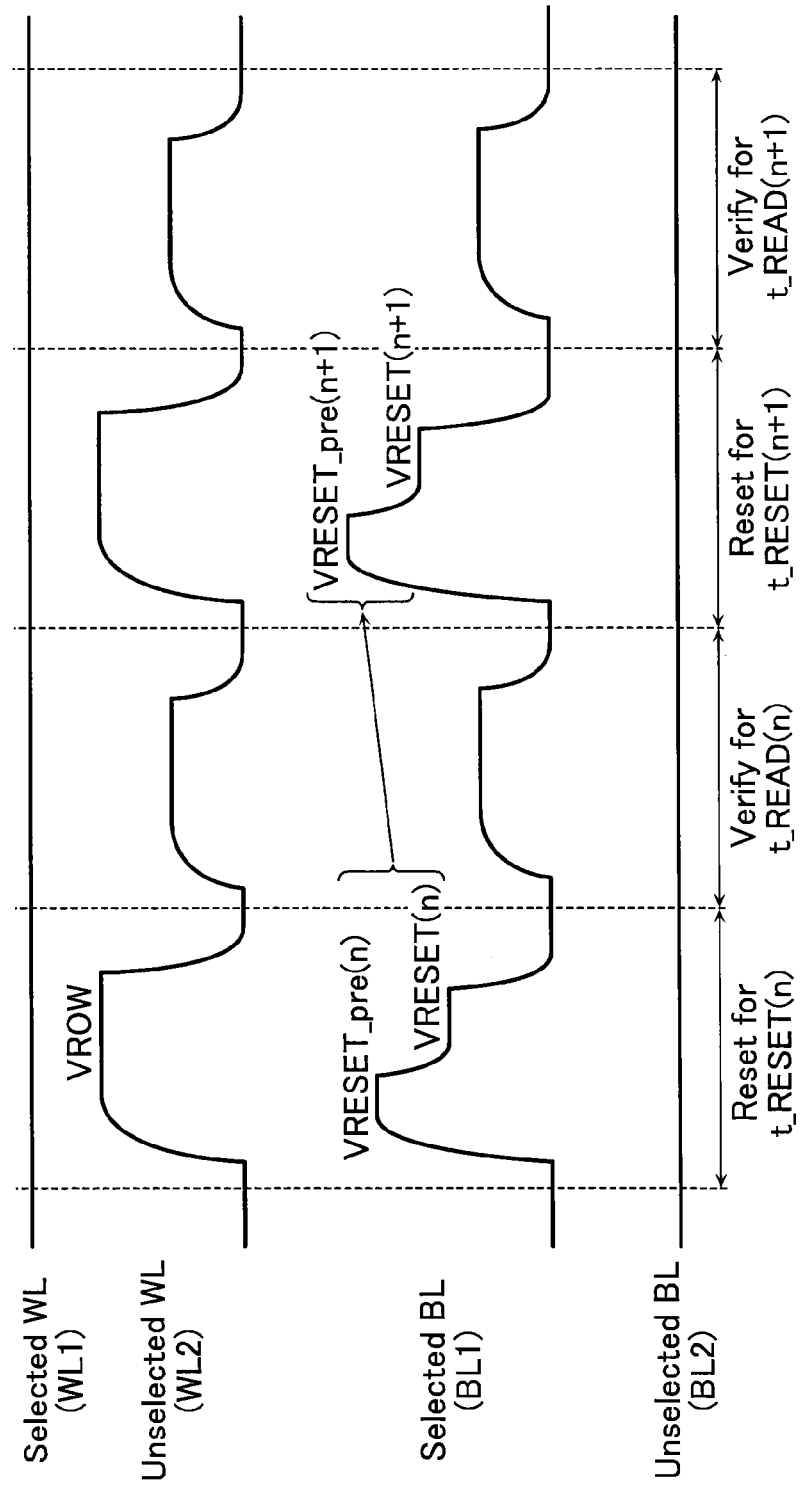
FIG. 18 is a timing chart showing a resetting operation according to a fourth embodiment.

Referring now to FIG. 18, the operation of the nonvolatile semiconductor memory device according to a fourth embodiment will be described. FIG. 18 is a timing chart showing a resetting operation of the nonvolatile semiconductor memory device according to the fourth embodiment. Only the resetting operation in the nonvolatile semiconductor memory device according to the fourth embodiment is different from that of each of the first to third embodiments. In the fourth embodiment, the same reference numerals are designated to components similar to those of the first to third embodiments and their description will not be repeated.

As shown in FIG. 18, in the fourth embodiment, the control circuit CC alternately executes the resetting operation and a verifying operation. The control circuit CC sets a voltage VRESET_pre(n+1) and a voltage VRESET(n+1) at the time of the (n+1)th resetting operation to be larger than a voltage VRESET_pre(n) and a voltage VRESET(n) at the time of the n-th resetting operation. That is, the control circuit CC according to the fourth embodiment alternately performs the resetting operation and the verifying operation and, as the number of times of the resetting operation increases, increases the voltage VRESET_pre(n) and the voltage VRESET(n) step by step. The control circuit CC according to the fourth embodiment may increase any one of the voltage VRESET_pre(n) and the voltage VRESET(n) step by step as the number of times of the resetting operation increases. The control circuit CC does not apply voltage to the selected memory cell MC which is determined to have been reset by the verifying operation, in the subsequent resetting operation.

[Advantages of Nonvolatile Semiconductor Memory Device According to Fourth Embodiment]

The nonvolatile semiconductor memory device according to the fourth embodiment has the characteristics similar to those of the first embodiment, and produces advantages similar to those of the first embodiment. The control circuit CC according to the fourth embodiment alternately executes the resetting operation and the verifying operation and, as the number of times of the resetting operation increases, increases the voltage VRESET_pre(n) and the voltage VRESET(n) step by step. The control circuit CC does not apply voltage to the selected memory cell MC which is determined to have been reset by the verifying operation, in the subsequent resetting operation. By these operations, the nonvolatile semiconductor memory device according to the fourth embodiment can execute stable resetting operation on a plurality of memory cells MC whose thresholds to be reset vary.

[Fifth Embodiment]
[Operation of Nonvolatile Semiconductor Memory Device According to Fifth Embodiment]

Figure 19:
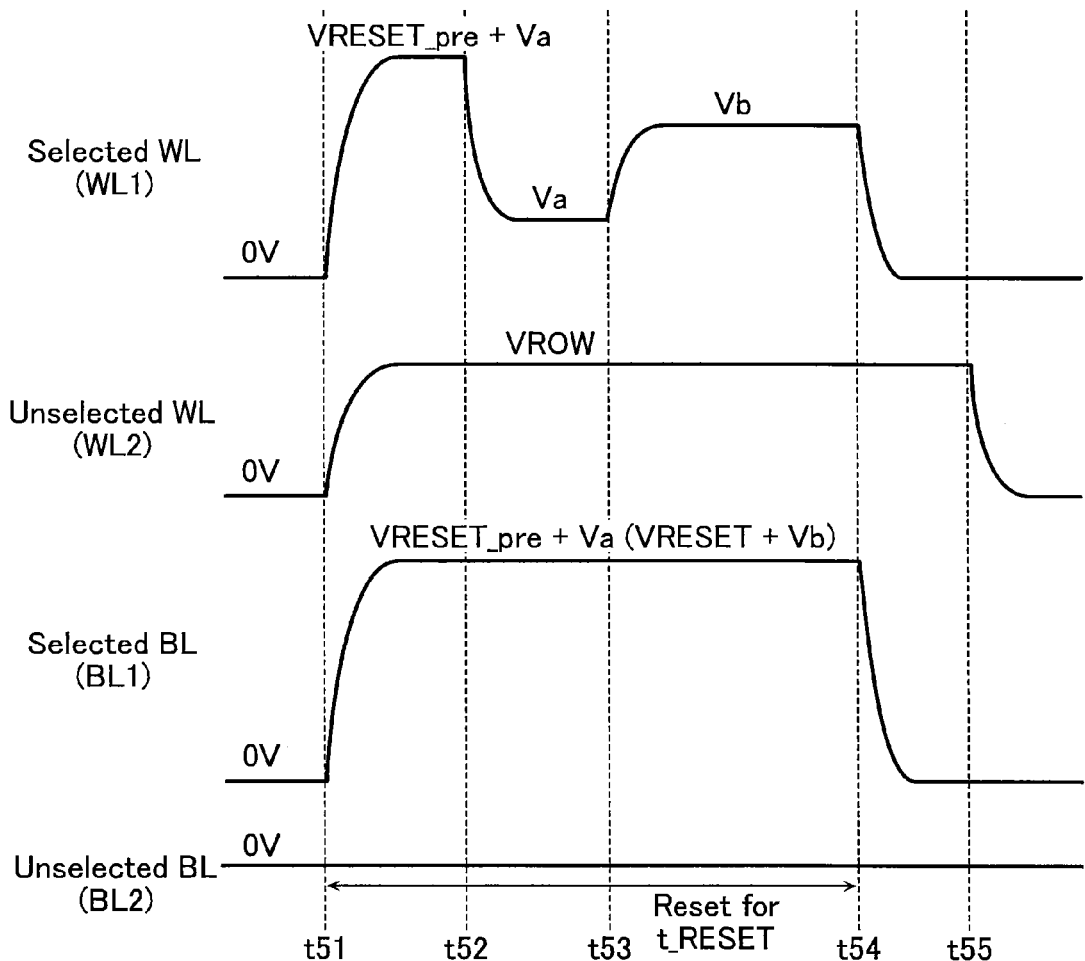
FIG. 19 is a timing chart showing a resetting operation according to a fifth embodiment.

Referring now to FIG. 19, the operation of the nonvolatile semiconductor memory device according to a fifth embodiment will be described. FIG. 19 is a timing chart showing a resetting operation according to the fifth embodiment. Only the resetting operation in the nonvolatile semiconductor memory device according to the fifth embodiment is different from that of each of the first to fourth embodiments. In the fifth embodiment, the same reference numerals are designated to components similar to those of the first to fourth embodiments and their description will not be repeated.

As shown in FIG. 19, at time t51, the control circuit CC increases the voltages to be applied to the selected word line WL and the selected bit line BL to a voltage VRESET_pre+Va. In this case, the voltage VRESET_pre+Va is equal to a voltage VRESET+Vb. At time t51, the control circuit CC increases the voltage to be applied to the unselected word line WL to the voltage VROW.

Next, at time t52, the control circuit CC decreases the voltage to be applied to the selected word line WL to the voltage Va. In a manner similar to the first to fourth embodiments, the voltage VRESET_pre is applied to the selected memory cell MC connected to the selected bit line BL and the selected word line WL.

Subsequently, at time t53, the control circuit CC increases the voltage to be applied to the selected word line WL to a voltage Vb. By the operation, in a manner similar to the first to fourth embodiments, the voltage VRESET is applied to the selected memory cell MC connected to the selected bit line BL and the selected word line WL.

Next, at time t54, the control circuit CC decreases the voltages to be applied to the selected word line WL and the selected bit line BL to the ground voltage. That is, the control circuit CC executes the resetting operation from time t51 to time t54. At time t55, the control circuit CC decreases the voltage to be applied to the unselected word line WL to the ground voltage.

[Advantages of Nonvolatile Semiconductor Memory Device according to Fifth Embodiment]

The nonvolatile semiconductor memory device according to the fifth embodiment has the characteristics similar to those of the first embodiment, and produces advantages similar to those of the first embodiment.

[Other Embodiments]

Although the embodiments of the present invention have been described above, the invention is not limited to the embodiments. Various changes, additions, and the like can be made without departing from the scope of the invention.

What is claimed is:

1. A nonvolatile semiconductor memory device comprising:
 a semiconductor substrate;
 a plurality of memory cell arrays stacked on the semiconductor substrate and including a plurality of first wirings, a plurality of second wirings formed so as to cross the first wirings, and memory cells disposed at intersections of the first wirings and the second wirings and each having a variable resistive element connected in series; and
 a control circuit configured to selectively drive the first wirings and the second wirings,
 the control circuit executing a resetting operation to change a state of the variable resistive element from a low resistance state to a high resistance state, and at a time of executing the resetting operation, the control circuit increasing a pulse voltage to be applied to the variable resistive element to a first voltage, keeping the pulse voltage at the first voltage from a beginning time of the resetting operation to a first time, decreasing the pulse voltage to a second voltage from the first time, and setting the pulse voltage to the second voltage from the first time to an ending time of the resetting operation, the second voltage being lower than the first voltage and higher than ground voltage, and being lower than a set value at which the variable resistive element changes from the high resistance state to the low resistance state.

2. The nonvolatile semiconductor memory device according to claim 1, wherein in at least one of a case of increasing the pulse voltage to the first voltage and a case of decreasing the pulse voltage to the second voltage, the control circuit changes the pulse voltage in a shape of steps.

3. The nonvolatile semiconductor memory device according to claim 1, wherein in a case of decreasing the pulse voltage to the second voltage, the control circuit changes the pulse voltage in a comb-teeth shape in which a peak value decreases with lapse of time.

4. The nonvolatile semiconductor memory device according to claim 1, wherein the first voltage is equal to or higher than a set voltage at which the variable resistive element changes from the high resistance state to the low resistance state.

5. The nonvolatile semiconductor memory device according to claim 1, wherein the control circuit alternately executes the resetting operation and a verifying operation and, as number of times of the resetting operation increases, increases the first voltage and the second voltage step by step.

6. The nonvolatile semiconductor memory device according to claim 1, wherein the control circuit increases a voltage to be applied to the second wirings to the first voltage while holding the first wirings at the ground voltage, and then decreases the voltage to be applied to the second wirings to the second voltage.

7. The nonvolatile semiconductor memory device according to claim 1, wherein the control circuit increases a voltage to be applied to the first wirings to a third voltage, increases a voltage to be applied to the second wirings to a fourth voltage higher than the third voltage, and then increases the voltage to be applied to the first wirings to a fifth voltage lower than the fourth voltage, a difference between the fourth voltage and the third voltage is the first voltage, and a difference between the fourth voltage and the fifth voltage is the second voltage.

8. The nonvolatile semiconductor memory device according to claim 1, wherein the control circuit executes the resetting operation on a selected memory cell by applying the pulse voltage in a forward direction of a rectifier element and applies an inverse bias voltage in the opposite direction of the rectifier element to a non-selected memory cell.

9. The nonvolatile semiconductor memory device according to claim 8, wherein the control circuit increases the pulse voltage to the first voltage and increases the inverse bias voltage to a sixth voltage.

10. The nonvolatile semiconductor memory device according to claim 8, wherein the control circuit decreases the pulse voltage from the first voltage to the second voltage, and then decreases the inverse bias voltage to a seventh voltage higher than the ground voltage.

11. The nonvolatile semiconductor memory device according to claim 8, wherein the control circuit decreases the pulse voltage from the second voltage to the ground voltage, and then decreases the inverse bias voltage to the ground voltage.

12. The nonvolatile semiconductor memory device according to claim 1, wherein the control circuit comprises a regulator configured to generate the first voltage and the second voltage, the regulator comprises:

a node connected to one of the first wirings or one of the second wirings;

a plurality of resistive elements having one ends commonly connected to the node; and a transistor connected to the other end of each of the plurality of resistive elements, the plurality of resistive elements have different resistance values, and by controlling a conduction state of each of the transistors, the first voltage and the second voltage are generated.

13. The nonvolatile semiconductor memory device according to claim 1, wherein the variable resistive element comprises a composite compound containing at least two kinds of cationic elements.

14. A nonvolatile semiconductor memory device comprising:

a semiconductor substrate;

a plurality of memory cell arrays stacked on the semiconductor substrate and including a plurality of first wirings, a plurality of second wirings formed so as to cross the first wirings, and memory cells disposed at intersections of the first wirings and the second wirings and each having a variable resistive element connected in series; and a control circuit configured to selectively drive the first wirings and the second wirings, the control circuit executing a resetting operation to change a state of the variable resistive element from a low resistance state to a high resistance state, and at a time of executing the resetting operation, the control circuit applying a reset voltage to the variable resistive element from a beginning time of the resetting operation to a first time so that the reset voltage comprises n (n≧2) pulses which reach a first voltage, and then decreasing the reset voltage to a second voltage from the first time, the second voltage being lower than the first voltage and higher than the ground voltage.

15. The nonvolatile semiconductor memory device according to claim 14, wherein the control circuit decreases a peak voltage of a pulse according to an increase in a number of times of applying a pulse.

16. The nonvolatile semiconductor memory device according to claim 14, wherein the control circuit decreases each voltage of the pulses from a peak voltage to the second voltage.

17. The nonvolatile semiconductor memory device according to claim 14, wherein the second voltage is lower than a set value at which the variable resistive element changes from the high resistance state to the low resistance state.

18. The nonvolatile semiconductor memory device according to claim 14, wherein the control circuit sets the reset voltage to the second voltage from the first time to an ending time of the resetting operation.

* * * * *